US008533546B1

(12) United States Patent
Ferguson et al.

(10) Patent No.: US 8,533,546 B1
(45) Date of Patent: Sep. 10, 2013

(54) RECONFIGURABLE SCAN CHAIN CONNECTIVITY TO ENABLE FLEXIBLE DEVICE I/O UTILIZATION

(75) Inventors: Kenneth William Ferguson, Burnaby (CA); Steven Yu Peng Ng, Vancouver (CA); Bradley Burke, Roseville, CA (US); Michel Duchesneau, Mirabel (CA); Aaron John Dennis, Saskatoon (CA); Philip Lyon Northcott, Coquitlam (CA); Kenneth David Wagner, West Vancouver (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/309,208

(22) Filed: Dec. 1, 2011

(51) Int. Cl.
*G01R 31/28* (2006.01)

(52) U.S. Cl.
USPC ............................................ 714/726; 714/727

(58) Field of Classification Search
USPC .................................. 714/724, 726, 727, 729
See application file for complete search history.

(56) References Cited

U.S. PATENT DOCUMENTS

| | | | | |
|---|---|---|---|---|
| 5,440,567 | A | * | 8/1995 | Tsukamoto .................... 714/727 |
| 6,018,815 | A | * | 1/2000 | Baeg .............................. 714/726 |
| 6,049,901 | A | * | 4/2000 | Stock et al. .................... 714/726 |
| 6,842,039 | B1 | * | 1/2005 | Guzman et al. ................. 326/38 |
| 7,124,340 | B2 | | 10/2006 | Bos |
| 7,159,159 | B2 | * | 1/2007 | Sunter ........................... 714/724 |
| 7,281,182 | B2 | * | 10/2007 | Gillis et al. .................... 714/726 |
| 7,409,612 | B2 | * | 8/2008 | Van De Logt et al. ......... 714/727 |
| 7,685,482 | B2 | * | 3/2010 | Warren .......................... 714/724 |

* cited by examiner

*Primary Examiner* — James C Kerveros
(74) *Attorney, Agent, or Firm* — Dennis R. Haszko

(57) ABSTRACT

The present disclosure provides systems and methods for testing an integrated circuit or device under test (DUT). A DUT of the present invention has a plurality of scan chains, a plurality of shift register elements each associated with a respective one of the scan chains, and a programmable switch matrix to configure shift register elements of a subset of the plurality of shift register elements to cause one shift register element of the subset to receive an interleaved test sequence, and to cause the interleaved test sequence to be shifted to other shift register elements in the subset, and to input deinterleaved test sequences to scan chains associated with the subset.

19 Claims, 15 Drawing Sheets parallel full-scan design functionally identical design using 2:1 scan compression

RECONFIGURABLE SCAN CHAIN CONNECTIVITY TO ENABLE FLEXIBLE DEVICE I/O UTILIZATION

FIELD OF THE INVENTION

The within disclosure relates generally to testing of integrated circuits (IC). More particularly, it is applicable to any IC implementing a parallel scan test strategy, wherein there may be a desire to reduce device manufacturing costs by varying pins available for testing, but without impacting test coverage or quality.

BACKGROUND OF THE INVENTION

Integrated circuit (IC) complexity has been increasing in accordance with Moore's law for several decades, approximately doubling the number of digital gates in a device every two years or less. This exponential rise in gate counts has resulted in rapidly escalating test complexity and cost. This has, in turn, driven the industry to adopt design-for-test (DFT) approaches such as "scan test" to enable automated test pattern generation and efficient test application with lower cost production test equipment. Scan testing is an industry-standard structural test methodology that has proven to be a highly effective methodology for screening defective IC's in production.

FIG. 1 shows an abstracted view of an IC 100 containing both combinational logic 101, such as "AND", "OR" and "NOT" gates, as well as memory elements 102 such as "flip-flops". At opposing ends of the IC are functional inputs 104 and functional outputs 106. The resulting sequential logic circuit is more complicated to test because it can be difficult to construct an efficient sequence of input states to ensure all combinational and memory elements are fully stimulated and any defective responses are propagated to output pins. These problems are generally referred to as "controllability" and "observability", respectively.

FIG. 2 shows the same abstracted IC 100 as FIG. 1, but with the addition of a test mode wherein all memory elements are connected into a simple serial shift register, known as a "scan chain" 200 having a scan input 202 and a scan output 204 at opposing terminals. Now the problem of controllability has been addressed, because all memory elements can be deterministically forced to any desired state, allowing control of all the inputs to the clouds of combinational logic. Also, the problem of observability has been addressed, because the value captured by all memory elements can be deterministically forced directly to the scan output pin 204.

Note that while FIG. 1 and FIG. 2 only show a small number of logic elements and input and output paths, a typical IC may contain millions of logic elements and hundreds of I/O pins. Also, while FIG. 2 shows separate device pins for functional and scan access, in a typical implementation, these pins will be shared using appropriate test-mode gating logic, such that a given pin may be used as a functional pin when the device is in functional mode, and the same pin may be used as a scan pin when in scan test mode.

Scan test data volume (i.e. stimuli and expected responses) grows with design size. In order to minimize test time and therefore test cost, scan data must either be shifted into and out of the device at higher speed, or with a higher degree of parallelism, or both. Shifting scan data at higher speeds adds design complexity, as it places tighter constraints on scan timing paths. Hence, the industry has generally adopted wider scan interfaces, with a typical deep sub-micron system-on-chip (SOC) device using dozens or even hundreds of parallel scan chains as shown conceptually in FIG. 3. The single scan chain 200 routed serially through every memory element in the design shown in FIG. 2 has been replaced with two separate scan chains 300, 301, each routed serially through half the memory elements 102 in the design. Each memory element 102 has the exact same degree of controllability and observability, but can be accessed with half the number of scan shift events. While the total volume of scan data has not been affected, it is being loaded and unloaded into the scan chains with twice the efficiency resulting in half the total test time and hence half the total test cost. A relatively simple IC with a parallel, full-scan design is shown in FIG. 4a.

As noted previously, this a very simple, abstracted example. In a modern SOC device with millions of memory elements and hundreds or thousands of signal pins, the test and complexity and hence test cost can be much, much higher, driving a corresponding increase in parallelism.

To further reduce scan data volume and test cost, it is now common to implement some sort of on-chip circuitry to enable scan data compression. There are a variety of methodologies in this regard, but all methods share a common architecture, which is shown in abstracted form in FIG. 4b. Each scan chain 400 is broken up into a number of smaller scan chains 402 that are driven in parallel from a single scan input pin 404. The resulting scan chain outputs 406 are logically recombined, such as by using an XOR tree 408, before being driven to a single scan output pin 410. FIG. 4b shows a simple 2:1 compression ratio; however, much higher ratios are possible for devices incorporating very long scan chains.

Highly parallel scan testing has enabled reduced production test costs and hence improved product profitability. However, escalating design complexity and cost has resulted in a new set of challenges to the traditional scan architecture. Multi-product designs, wherein one IC is intended to be used in many target products or applications, as well as multi-die packaging technology such as MCM, SIP, and 3-D or stacked-die, have resulted in devices where some I/O pins may not be accessible for application of scan data in some package variants. This means a choice between compromised test coverage on some variants (due to not being able to access some scan chains), or increased test cost on all variants (due to constraining the design to use fewer, longer scan chains).

In extreme cases, package variants may not even be predictable at design time, meaning a high risk of future costs due to being forced either to connect otherwise unused pins to enable full scan coverage, or to redesign the IC to use fewer scan chains.

In a multi-product device with some pins not required in some target markets, there may be a desire to reduce package cost by not bonding out unused pins. There may also be other reasons not to connect all pins in the package, for example, to limit functionality in certain product variants to provide different price points to customers.

However, failure to connect certain pins in the package limits the selection of I/O's to be used for test purposes, hence limiting the degree of scan parallelism. In effect, the design team is forced to choose between using a small set of common pins for scan testing (resulting in high test cost), or being forced always to bond out a large number of pins in all cases for efficient scan test (resulting in high package cost and poor product differentiation).

FIG. 5 provides a graphical representation of this issue. In the abstracted product, certain I/O pins 500 are not available in package variants and therefore cannot be allocated to scan chains 502 (dashed lines). Consequently, the total number of scan chains 502 in the design is reduced, and the overall test time is increased for all package variants, not just the reduced-pin variant.

This predicament can be expected to escalate in the future, with the advent of even more complex and expensive packaging technologies, in particular multi-die packages such as multi-chip modules (MCMs), system-in-package (SIPs), stacked-die, etc. It will be critical to have very high test coverage at the bare-die level to ensure only good dies are included in assembled packages This necessitates highly parallel scan testing and hence very wide scan input and output buses. However, many or even most of the pins on some of the die in a multi-die package may only be connected to other die and hence may not be accessible for final package testing, meaning either package test coverage must be compromised due to not all scan chains being accessible, or overall test cost must be increased by only allowing a reduced set of the available pins on the die to be used for scan testing.

There is therefore a need to address some or all of the issues described above by enabling any number of pins to be used for scan testing at any stage in the design, without any loss of test coverage or a need to regenerate scan data.

SUMMARY OF THE INVENTION

In a first aspect, the present disclosure provides a device under test (DUT) having a plurality of scan chains, a plurality of shift register elements, each associated with a respective one of the scan chains and a programmable switch matrix to configure shift register elements of a subset of the plurality of shift register elements to cause one shift register element of the subset to receive an interleaved test sequence, and to cause the interleaved test sequence to be shifted to other shift register elements in the subset, such that deinterleaved test sequences are input to scan chains associated with the subset.

In a second aspect, the DUT also has a plurality of device scan pins each associated with a shift register element.

In a further aspect, the device scan pin associated with the one shift register element provides the interleaved test sequence to the subset.

In yet a further aspect, the programmable switch matrix configures multiplexers in each of the shift register elements of the subset such that the one shift register element uses a parallel path to receive the interleaved test sequence from the device scan pin associated with the one shift register element; and the other shift register elements in the subset use a serial path to receive the interleaved test sequences from the one shift register element.

According to another aspect, the programmable switch matrix further comprises at least one configurable crossbar switch for routing the interleaved test sequence from any of the device scan pins to any of the plurality of shift register elements.

In still another aspect, the at least one configurable crossbar switch is configured to balance the number of shift events between a plurality of subsets.

In yet another aspect, the DUT can comprise a bypass path for bypassing the plurality of shift register elements.

In addition, the DUT can also have a second programmable switch matrix to configure a subset of shift register elements at the output of the scan chains to cause the shift register elements of the subset at the output to receive deinterleaved test sequences to be shifted to one of the shift register elements in the subset at the output, such that an interleaved output test sequence is provided to an output pin associated with the one of the shift register elements in the subset at the output.

Further, the programmable switch matrix configures multiplexers in each of the shift register elements of the subset at the output such that the one of the shift register elements in the subset at the output uses a parallel path to provide the interleaved output test sequence to the output pin and the register elements in the subset at the output use a serial path to provide the deinterleaved test sequences to the one of the shift register elements in the subset at the output.

The present disclosure also provides that the programmable switch matrix can include at least a second crossbar switch for routing interleaved test sequences from any shift register elements at the output to any output pin.

In another aspect, the at least a second crossbar switch is configured to balance the number of shift events between a plurality of subsets of shift register elements at the output of the scan chains.

In yet another aspect, the DUT can also have a bypass path for bypassing the shift register elements at the output of the scan chains.

The present disclosure also provides for a method of testing a device under test (DUT), the DUT having a plurality of scan chains and a plurality of shift register elements each associated with a respective scan chain, the method comprising determining a subset of the plurality of shift register elements to receive an interleaved test sequence, programmably configuring one shift register element of the subset to receive the interleaved test sequence, receiving the interleaved test sequence at the one shift register element, programmably configuring the other shift registers in the subset such that the interleaved test sequence is shifted to others in the subset and deinterleaved test sequences are input to scan chains associated with the subset, and receiving deinterleaved test sequences output from the scan chains.

In a further aspect, the steps of programmably configuring include programmably re-configuring.

In a further aspect, the present disclosure provides a DUT comprising a plurality of scan chains, a plurality of shift register elements, each associated with a respective one of the scan chains, and a programmable switch matrix to configure a subset of shift register elements at the output of the scan chains to cause the shift register elements of the subset at the output to receive deinterleaved test sequences to be shifted to one of the shift register elements in the subset at the output, such that an interleaved output test sequence is provided to an output pin associated with the one of the shift register elements in the subset at the output.

In yet a further aspect, the programmable switch matrix configures multiplexers in each of the shift register elements of the subset at the output such that the one of the shift register elements in the subset at the output uses a parallel path to provide the interleaved output test sequence to the output pin and the register elements in the subset at the output use a serial path to provide the deinterleaved test sequences to the one of the shift register elements in the subset at the output.

In still a further aspect, the programmable switch matrix may also include at least one configurable crossbar switch for routing the interleaved output test sequence from any of the shift register elements to any of a plurality of output pins.

In another aspect, the at least one configurable crossbar switch is configured to balance the number of shift events between a plurality of subsets.

Other aspects and features of the present disclosure will become apparent to those ordinarily skilled in the art upon review of the following description of example embodiments in conjunction with the accompanying figures.

BRIEF DESCRIPTION OF THE DRAWINGS

Example embodiments will now be described, by way of example only, with reference to the attached Figures, wherein.

DETAILED DESCRIPTION

Figure 1:
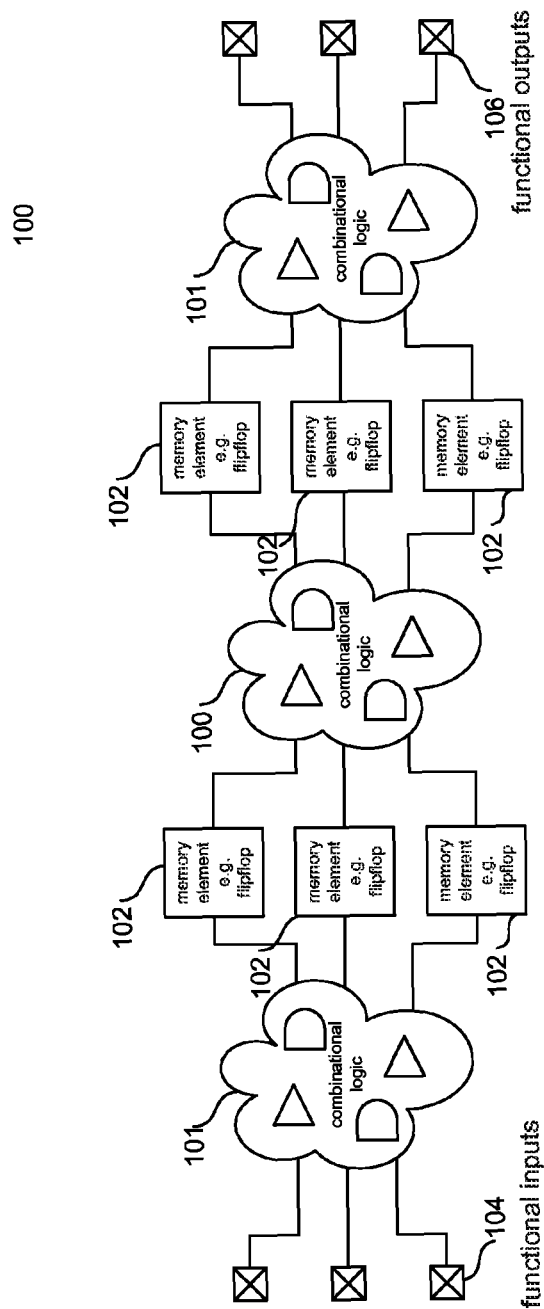
FIG. 1 is an abstracted sequential logic circuit.
Figure 2:
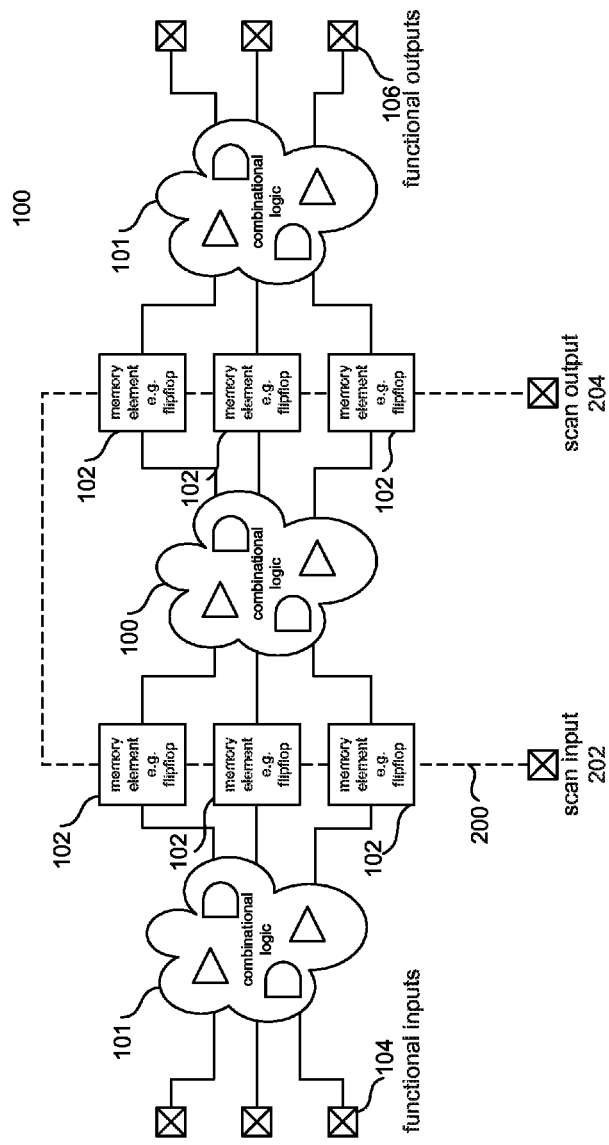
FIG. 2 is a sequential circuit with single serial scan test path.
Figure 3:
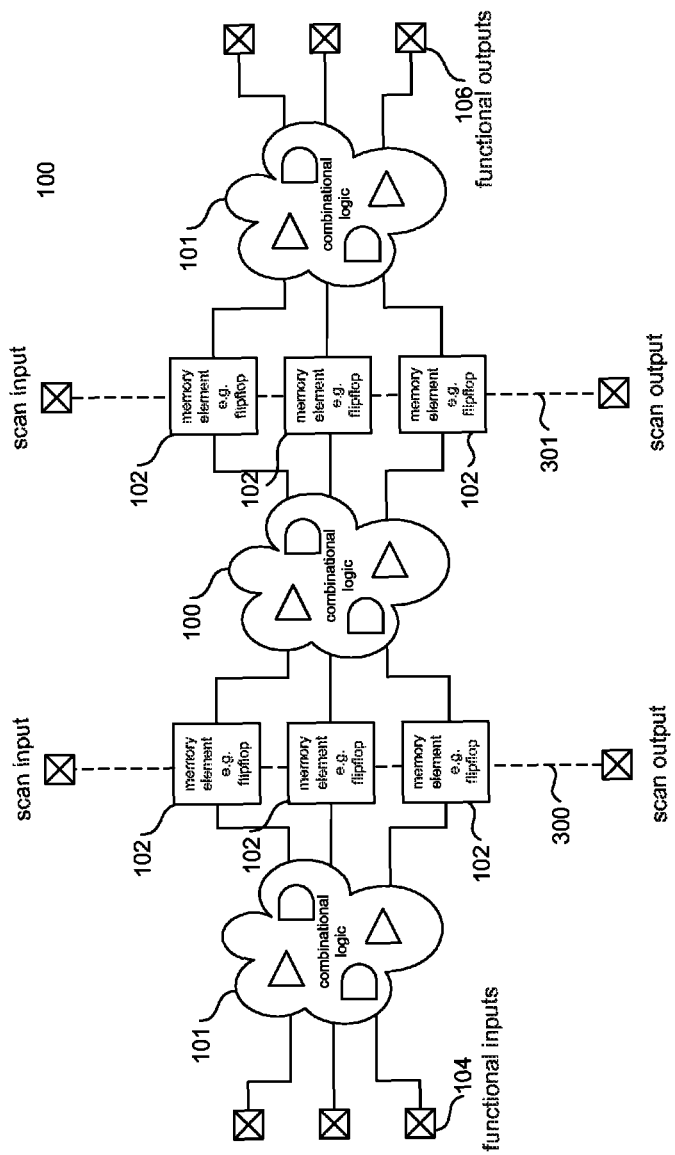
FIG. 3 is a sequential circuit with a basic parallel scan test architecture.
Figures 4A, 4B:
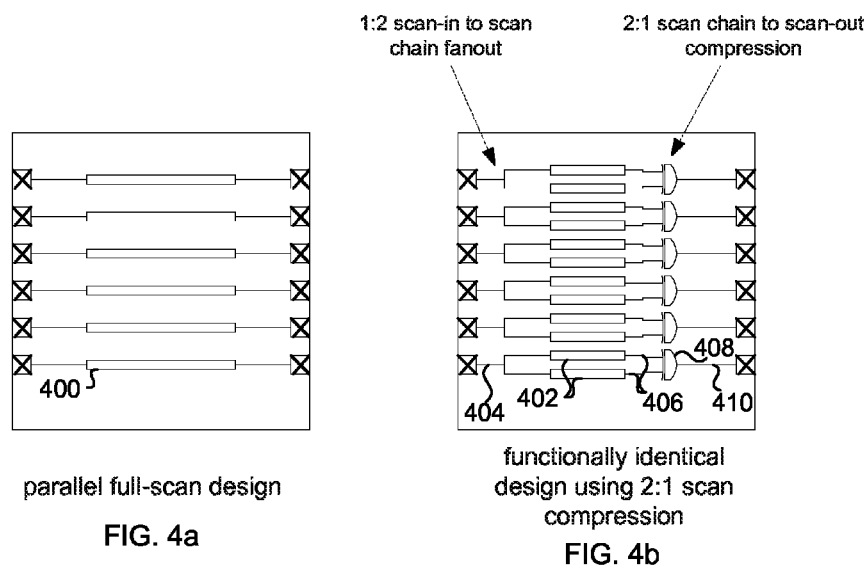
FIG. 4a is a sequential circuit with a parallel, full-scan design.
FIG. 4b is a sequential circuit with a parallel, full-scan design with 2:1 scan compression.
Figure 5:
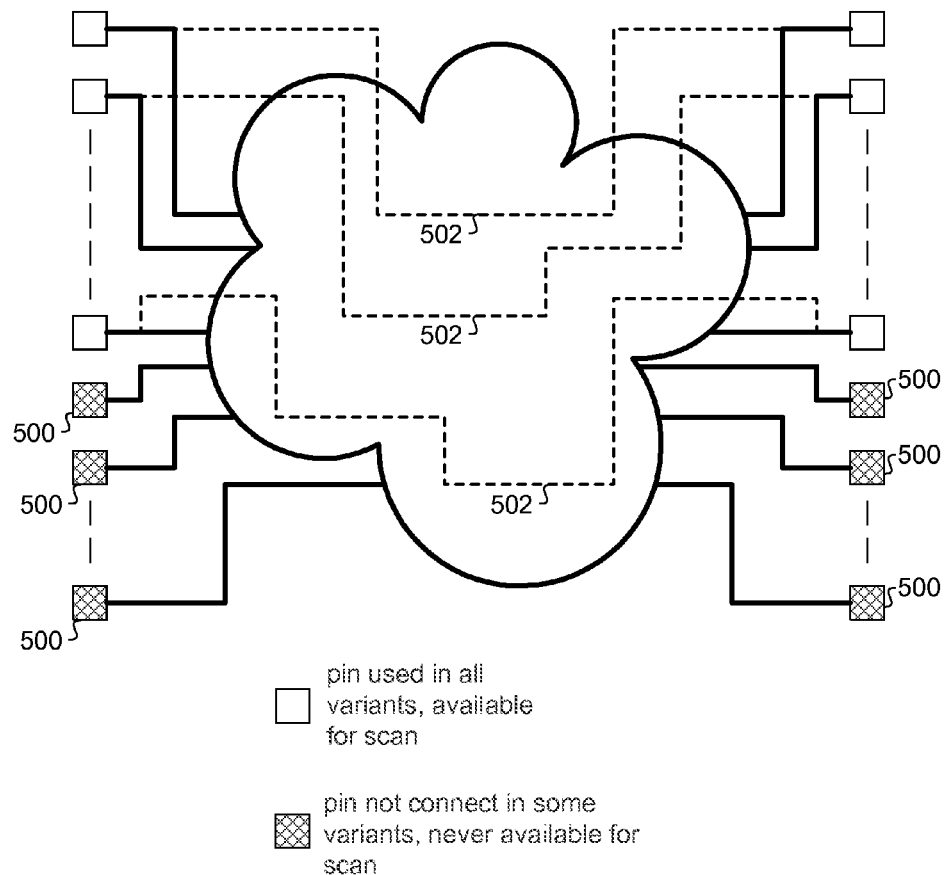
FIG. 5 is an abstraction of a multi-product die with reduced-pin package variants.

Generally, the current invention comprises an architecture to enable reconfigurable access to an IC implementing a parallel scan chain testing strategy. More specifically, embodiments of the present disclosure provide a reconfigurable, on-the-fly scan chain access architecture that enables any arbitrary combination of device I/O pins to be used to access any number of internal parallel scan chains, such that all chains will be fully controllable and observable regardless of which device I/O pins are available in any specific packaging variant.

This approach has a number of commercial advantages, including, but not limited to, the following: a design team is able to use the maximum possible number of scan chains supported by the I/O count at the die level, while a marketing team is able to retroactively define new package variants with arbitrary I/O bond-out combinations, and a production engineering team is free to migrate to reduced pin count production test equipment, without any loss of test coverage, and without the need to generate new scan test data.

Embodiments of the present invention are compatible with common scan architectures including, but not limited to, full-chip scan, hierarchical or macro-based scan, and various scan compression techniques such as Illinois scan. Current approaches to scan testing of digital integrated circuits are exemplified in the following documents, the disclosures of which are hereby incorporated by reference in their entirety:
i. Navabi, Digital System Test and Testable Design, Springer, 2011;
ii. Vranken et al., Enhanced Reduced Pin-Count Test for Full-Scan Design, Proceedings of the International Test Conference, 2001, pp. 738-747; and,
iii. U.S. Pat. No. 7,124,340, Low Pin Count, High-Speed Boundary Scan Testing.

Embodiments disclosed herein permit scan chain design optimization independent of the number of device-under-test (DUT) I/O pins actually available for scan data insertion and observation, and further permit reconfiguration of device pin to scan chain mapping without design changes, loss of coverage, or regeneration of test data.

Under a proposed architecture according to certain embodiments, a DUT implemented using parallel scan techniques would also instantiate a scan pin reconfiguration block at the head (scan-in) and/or tail (scan-out) of the scan chains. The two reconfiguration blocks can be programmed to serialize the first and last cells respectively in any arbitrary group or groups of scan chains, such that they can be accessed using fewer DUT pins than was originally assumed to be available during the design development. For example, if a particular target application does not require a specific interface on the DUT, those interface pins may simply be dropped from the package, and the scan chains that would have been accessed using those pins are reconfigured to be driven from adjacent pins that are still available. Since the reconfiguration blocks still provide independent control and observability of the data shifted through every scan chain, there is no need to regenerate scan data since any given target test vector can still be realized in the DUT. The scan data or test data simply needs to be reconfigured to match the pin reconfiguration. In another example, if there is a desire to migrate the production test for a given (mature) DUT to a reduced pin count test platform, the DUT does not need to be redesigned, since pins can simply be removed from the production test and the reconfiguration blocks again used to maintain identical scan test coverage.

Invention Architecture

Figure 6:
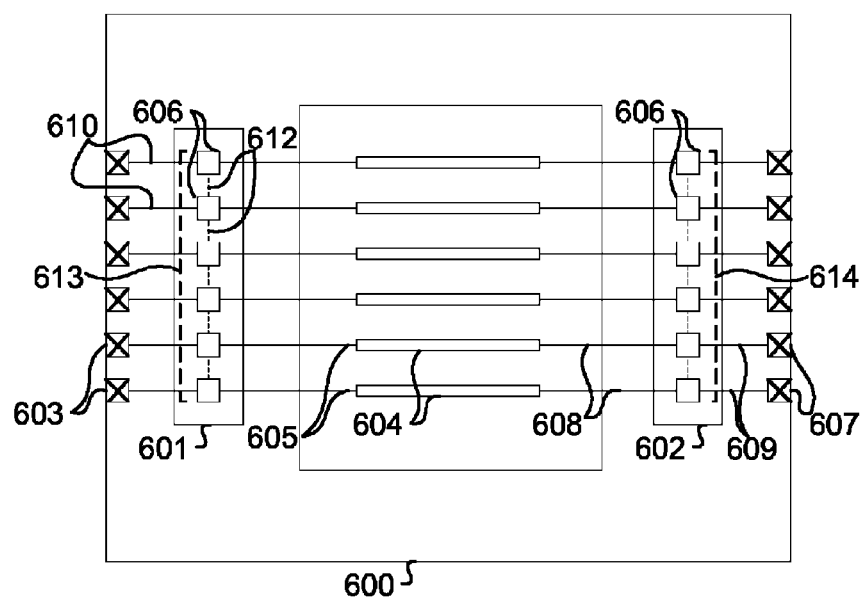
FIG. 6 is a device implementing scan reconfiguration blocks with meta-scan chains.

FIG. 6 shows an abstracted view of an exemplary device implementing "meta-scan chains" at the input and output of the normal scan chains in accordance with certain embodiments. Starting with an IC design 600 implementing a parallel scan architecture, embodiments of the present disclosure involve the addition of a scan signal reconfiguration block 601 between the device scan pins (sometimes referred to as input pins) 603 and the scan inputs 605 to the parallel scan chains 604. Similarly, embodiments include the addition of a second scan signal reconfiguration block 602 between the device output pins 607 and the scan outputs 608 of the parallel scan chains 604. Beyond these additional blocks 601, 602, the scan architecture of the device 600 can remain unchanged, meaning the scan chains 604 may internally implement compression, hierarchical design or any other features which will be appreciated by one of ordinary skill in the art. From the perspective of test pattern generation, the reconfiguration blocks 601, 602 can be considered completely transparent and the high level device design and DFT flow left unchanged.

Each of the scan signal reconfiguration blocks 601, 602 implements a programmable shift register 613, 614 made of a number of shift register elements 606, and, in certain embodiments, the shift registers 613, 614 are equal in length to the total number of device scan pins 603 or device output pins 607 routed to the block. In certain embodiments, each shift register element 606 is associated with a device scan pin 603 and a scan chain 604 and can be programmed to take its input either from a parallel-load path 610 or a serial-shift path 612.

The selection of whether to use the parallel or serial path is programmable per element 606.

Each scan signal reconfiguration block 601, 602 also optionally implements a bypass path (not shown), to bypass the shift register entirely, in cases where all DUT pins are available for testing.

The scan signal reconfiguration block shift registers 613, 614 are referred to as "meta-scan" shift chains, as they represent a scan-style mechanism for accessing the scan chains 604, which are themselves a mechanism for accessing the functional logic in a test mode. Shift events in the meta-scan shift chains are correspondingly referred to as meta-scan shift events, to discriminate from regular scan chain shift events. A meta-scan shift event does not, in other words, involve the transmission of test sequences through a scan chain; rather, it is the shift of a testing sequence through the meta-scan shift chains themselves. The utility of the meta-scan shift chains will be described in detail below.

Figure 7:
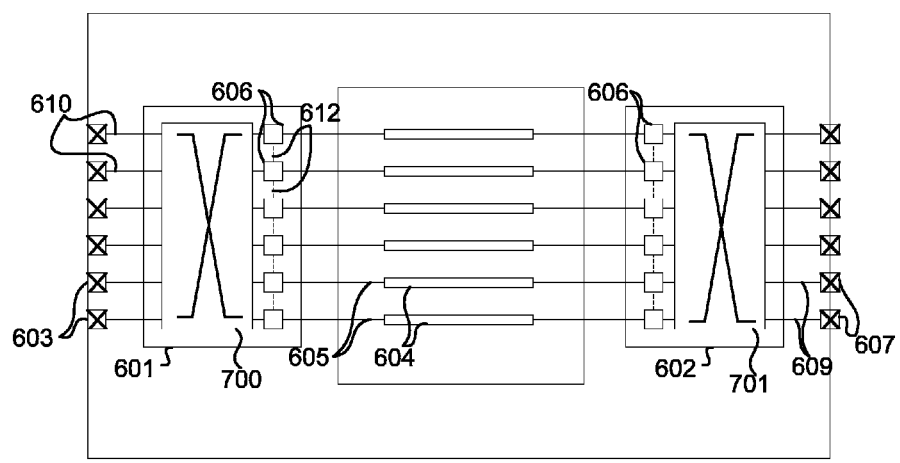
FIG. 7 is a device implementing scan reconfiguration blocks with meta-scan chains and a crossbar switch matrix.

FIG. 7 shows an abstracted view of a device implementing scan reconfiguration blocks 601, 602 each containing an optional crossbar switch 700, 701 in accordance with certain embodiments. The crossbar switches 700, 701 allow any scan signal input to the block 601, 602 to be routed to any scan signal output of the block 601, 602. This is a strictly one-to-one mapping, i.e. each scan reconfiguration block input can be connected to any one scan reconfiguration block output at a time, and vice versa. The utility of the switch matrix will be described in detail below.

Configuration Selection and Programming

As noted above, the selection of whether to use the parallel or serial path is programmable. Programming or programmably configuring of each element may be carried out by a programmable shift matrix (not shown), which drives the control elements in each shift register element 606. While the specific architecture of a shift register element 606 is discussed in greater detail below and with reference to FIG. 10, the programmable shift matrix generally consists of control inputs and multiplexers that directly determine the signal path each element will use. The programmable shift matrix according to certain embodiments also includes an interface for a user or tester to configure the shift register elements 606, or a subset thereof. In certain embodiments which have a scan reconfiguration block 602 between the output of the scan chains and the device output pins, there can be a second programmable shift matrix or simply include control functionality within a single programmable shift matrix.

In the degenerate case where all input 603 and output 607 pins are available for testing, the scan reconfiguration blocks 601, 602 will be programmed to use only the parallel-load path 610, or if implemented, the reconfiguration bypass path. In this case, the DUT input pins 603 drive the inputs to all scan chains directly, and all scan chain outputs drive DUT output pins 607 directly.

If one or more input pins 603 are unavailable for testing for any reason, then the input scan reconfiguration block shift register elements 606 corresponding to those pins will be configured to use the serial-shift path 612 rather than the parallel load path 610, while the elements 606 corresponding to the pins that are available for testing will continue to use the parallel load path 610. Meta-scan shift events will thus be interleaved in between normal scan shift events such that the reconfiguration shift register element 606 driving each normal scan chain 604 will be initialized to the same logical value that would have been applied directly from the DUT pin in the degenerate case. In this way, each scan chain 604 still receives the exact same input sequence that it would have received had all DUT pins been available for testing, and there is no overall loss in scan chain controllability.

Accordingly, the testing sequence input to the device scan pins 603 in a DUT will be interleaved in such a way that any subset of shift register elements 606 to which it is introduced will, by carrying out meta-scan shift events, modify the testing sequence such that deinterleaved testing sequences can be input onto the scan chains 604 with which the elements 606 are associated.

Likewise, where the testing sequence output from the scan chains 604 is deinterleaved and will pass through a subset of shift register elements 606 before reaching output pins 607, the deinterleaved signals will be "re-interleaved" to form an interleaved output signal. This is because certain of the elements 606 of the subset which are not directly associated with an active output pin may be configured by the programmable shift matrix to use a serial path to provide the deinterleaved test sequences to other members of the subset which are associated with an active pin.

Similarly, if one or more output pins 607 are unavailable for testing for any reason, then, in between normal scan chain shift events, the output scan reconfiguration block shift register in block 602 will first be switched to parallel-load mode, to capture the output of all scan chains 608. It will then be switched to serial-shift mode and the output data shifted as many times as is necessary to ensure all scan chain output bits have propagated to an observable output pin 607. In this way, there is also no overall loss in scan chain observability. Again, the output scan reconfiguration block shift events will be referred to as meta-scan shift events, to discriminate from regular scan chain shift-out events.

Because the scan reconfiguration blocks 601, 602 are reprogrammable entirely electronically, without requiring design changes, it is possible to reconfigure them on-the-fly to adapt to any available set of scan input 603 and output pins 607. Hence, there is freedom to arbitrarily remove pins from production test programs or device packaging variants with no loss of production test coverage.

Crossbar Switch Option

Under the methodology discussed above, if DUT pins are unavailable for testing, then meta-scan shift events may be interleaved between normal scan chain shift events. The number of meta-scan events per normal scan event depends on the maximum number of consecutive scan reconfiguration shift elements 606 that are connected to pins which are unavailable for testing. So, for example, if only one pin on the entire DUT is unavailable for testing, then exactly one meta-scan shift is required per normal scan shift. Likewise, if every alternate element in the scan reconfiguration shift register is connected to a pin which is unavailable for testing, then there is still only exactly one meta-scan shift per scan shift, because all the meta-scan shift chains are being loaded in parallel. However, if two consecutive elements 606 in the scan reconfiguration shift register are connected to pins which are unavailable for testing, then there will be two meta-scan shift event required for every normal scan shift event.

Thus, depending on the ordering of the meta-scan shift register, some combinations of DUT pins will result in significant loss of scan shift efficiency, with a corresponding increase in test time and therefore test cost. In one embodiment, the available DUT pins are distributed uniformly, or "balanced" across the scan reconfiguration shift register or between subsets of shift register elements 606, regardless of which, and how many, DUT pins are available in any given device configuration.

One solution, which is considered as an optional aspect of embodiments of the current disclosure, is to include a programmable crossbar switch matrix 700 in a scan signal reconfiguration block 601, 602. In this case, after the decision is made regarding which pins are to be available for testing, the crossbar 700 can be configured appropriately to distribute those pins optimally across the scan reconfiguration block shift register to minimize the number of meta-scan shift events required for each normal scan shift event. For an N-bit scan reconfiguration block register, a full N*N switch matrix will clearly provide the maximum flexibility to optimize meta-scan shift efficiency. If the extra area on the device required by such a matrix 700 may be considered detrimental to the device cost, other configurations are possible.

For example, a full N*N switch can be optionally included in a scan input reconfiguration block 601, the scan output reconfiguration block 602, both blocks, or neither. It is also possible that a number of smaller switches of identical or varying sizes could likewise be designed to allow improved flexibility within sub-groups of DUT pins. None of these options impact the ability of embodiments of the present disclosure to provide full control and observability of all scan chain elements, they only impact the efficiency of the application of scan testing for certain otherwise non-optimal combinations of available DUT pins.

Embodiments of the current invention do not presume any particular implementation of the crossbar switch matrix 700, and hence include all possible variations. In one embodiment, control of the crossbar switch matrix is integrated into the programmable switch matrix discussed above. In this embodiment, the programmable switch matrix can, therefore, program routing of the interleaved or deinterleaved sequences, according to any of the above, from any of the device scan pins to any of the shift register elements 606, from any of the shift register elements 606 to any of the scan chains 604, from any of the scan chains to any of the shift register elements at the output end, and from any of the shift register elements at the output end to any of the device output pins.

Figure 8:
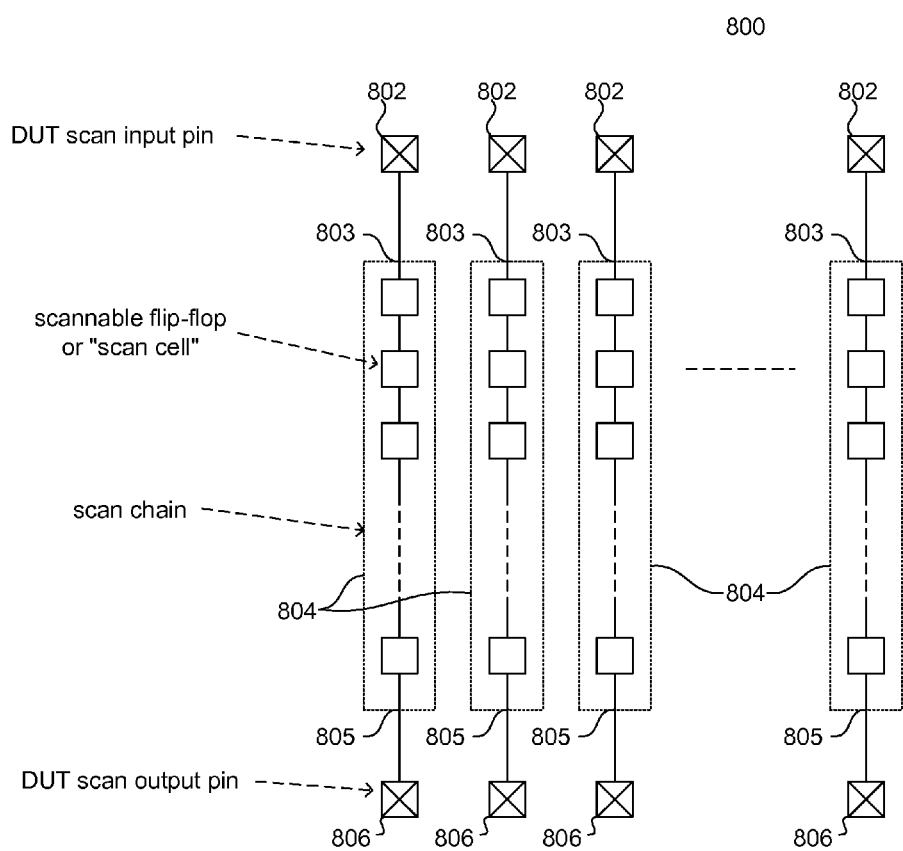
FIG. 8 is an example of a typical scan-tested integrated circuit.

Further, embodiments of the present disclosure have no specific dependency on the scan chain implementation, and hence can be used with all manner of advanced scan mechanisms, including but not limited to:
  i. transition and path delay scan testing
  ii. scan compression, both public-domain (e.g. "Illinois" architecture) and proprietary means
  iii. hierarchical or macro-based scan implementation Exemplary Embodiment FIG. 8 shows a typical IC 800 according to previous approaches, the inputs 803 to the scan chains 804 would be driven directly from device input pins 802 and the outputs 805 from the scan chains 804 would directly drive device output pins 806.

Figure 9:
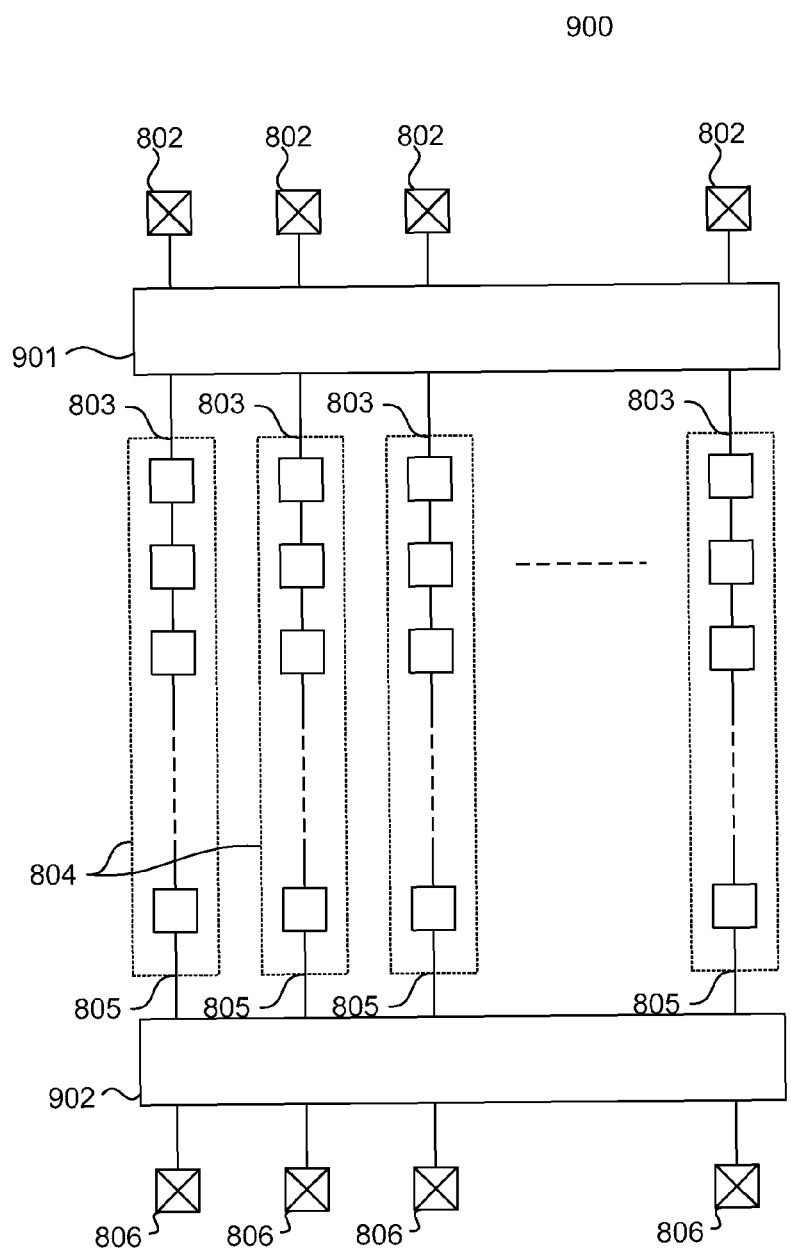
FIG. 9 is an exemplary scan-tested IC implementing scan reconfiguration block(s)

According to an embodiment and as shown in FIG. 9, an integrated circuit (IC) 900 is designed implementing a parallel scan testing methodology on one or more logic blocks. A scan reconfiguration block 901 is inserted between the device input pins 802 and the scan chain inputs 803, and another scan reconfiguration block 902 is inserted between the scan chain outputs 805 and the device output pins 806. Certain embodiments may include either or both scan reconfiguration blocks 901, 902, depending on which are deemed advantageous to a particular IC implementation.

Figure 10:
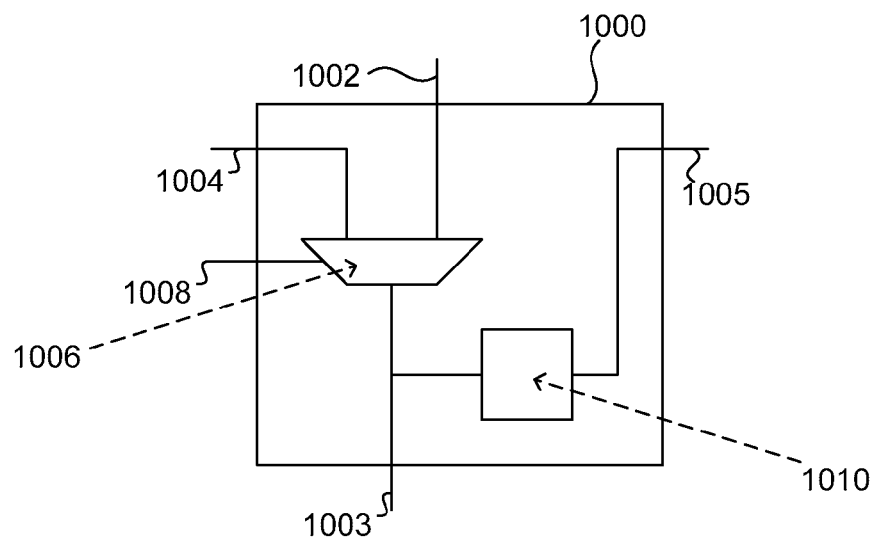
FIG. 10 shows an exemplary scan reconfiguration cell.

According to certain embodiments, the scan reconfiguration block 901, 902 consists of a series of scan reconfiguration cells as shown in FIG. 10, where each cell 1000 includes a multiplexed input to select from either a parallel input path 1002 or a serial input path 1004. Each of these inputs leads to a corresponding parallel output path 1003 and serial output path 1005. The cell includes a multiplexer (mux) 1006 driven by a mux input control 1008. The mux input control 1008 can be programmed independently per scan reconfiguration cell 1000. Each cell can also contain a flip-flop or memory element 1010, which acts as a shift register element in that particular cell.

Figure 11:
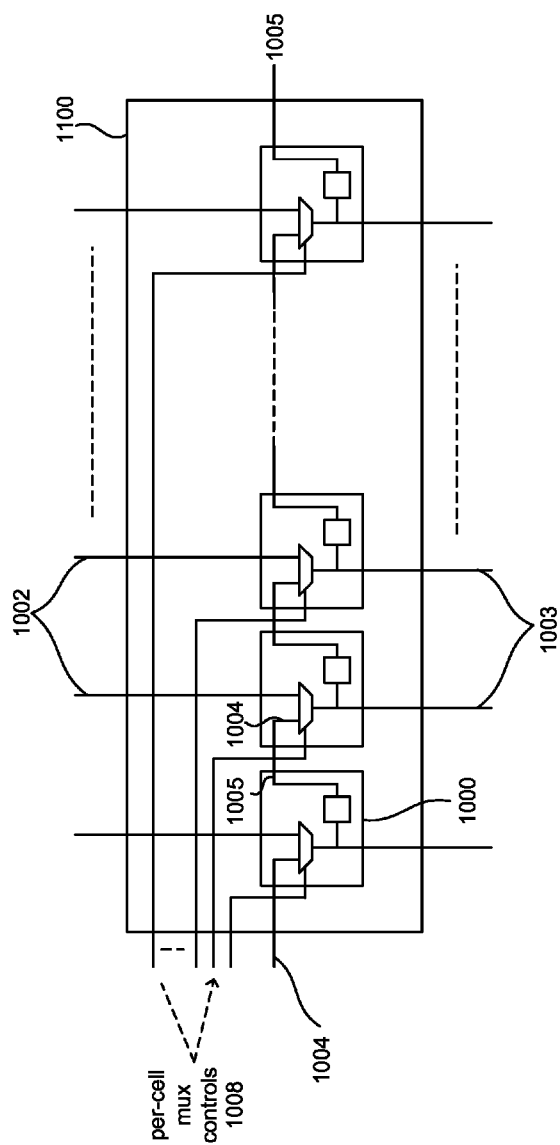
FIG. 11 scan reconfiguration cells arranged into a meta-scan shift chain.

An exemplary arrangement of a multitude of cells 1000 is shown to form a shift register also known as a meta-scan shift chain 1100, as shown in FIG. 11. As shown, the serial output path 1005 of each cell is the serial input path 1004 of the cell adjacent to it in the chain.

Figure 12:
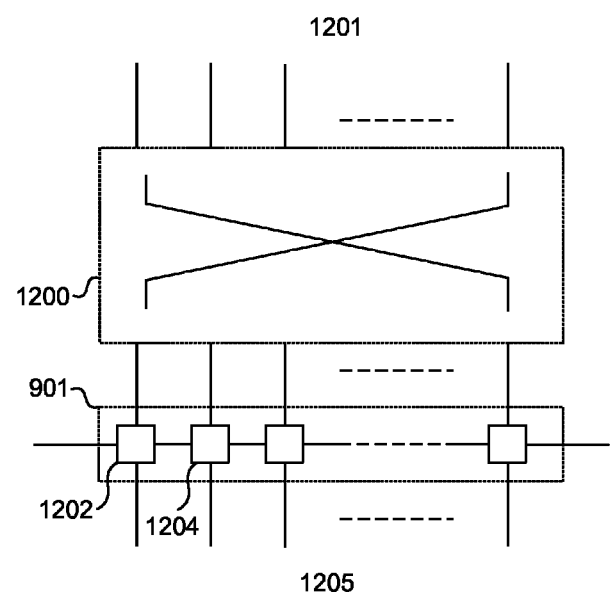
FIG. 12 shows a scan reconfiguration block with crossbar switch matrix on parallel inputs.
Figure 13:
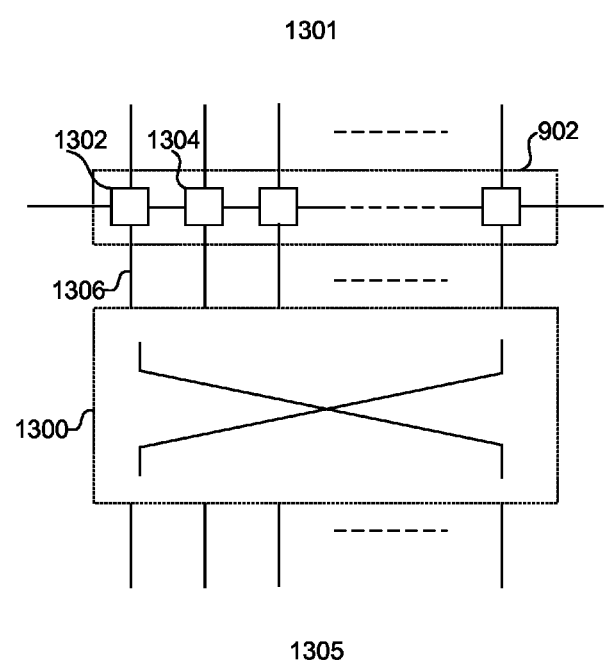
FIG. 13 is a scan reconfiguration block with crossbar switch matrix on parallel outputs.

As shown in FIGS. 12 and 13, an optional variation of the scan reconfiguration block according to an embodiment further includes one or more crossbar switch matrices. Matrices can be included on either the input side or the output side of each scan reconfiguration block.

FIG. 12 shows a complete, generalized scan input reconfiguration block 901 containing both a reconfigurable meta-scan shift chain, wherein each element 1202 can be loaded from either the parallel input or serially from the neighboring element 1204, and also containing a full crossbar switch matrix 1200, where the parallel input to each meta-scan chain element 1202 can be driven from any parallel input signal to the block. This block would normally be placed between DUT input pins 1201 and the inputs 1205 to the parallel scan chains within the DUT.

FIG. 13 shows a complete, generalized scan output reconfiguration block 902 containing both a reconfigurable meta-scan shift chain, wherein each element 1302 can be loaded from either the parallel input or serially from the neighboring element 1304, and also containing a full crossbar switch matrix 1300, wherein the parallel output 1306 from each meta-scan chain element 1302 can be routed to any parallel output signal from the block. This block would normally be placed between the outputs to the parallel scan chains 1003 within the DUT and the DUT output pins 1305.

The matrices 1200, 1300 may also be connected to only some or all of the scan reconfiguration cells 1000. It should be clear that many possible permutations of crossbar switch matrices 1200, 1300 are possible and different permutations may be advantageous in different designs. It is even possible that a permutation that only includes the crossbar switch(es) 1200, 1300 and does not include the meta-scan shift chain may be advantageous in some cases.

Figure 14:
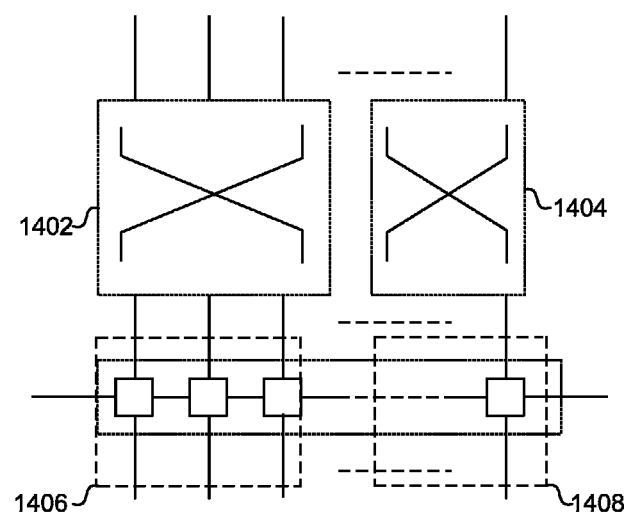
FIG. 14 is a scan reconfiguration input block with multiple crossbar switch matrices of different sizes; and, FIG. 15 is a further scan reconfiguration output block with multiple crossbar switch matrices of different sizes.

FIG. 14 shows a similar generalized scan input reconfiguration block 901 to that shown in FIG. 12; however, in this embodiment, the full crossbar switch matrix 1200 has been replaced with two smaller switch matrices 1402, 1404. This creates two smaller "groups" of signals which can be freely reconfigured within two subsets 1406, 1408 of shift register elements, but not between the two subsets 1406, 1408. While this may reduce the flexibility for redistributing DUT device scan pins across meta-scan parallel inputs, it may also result in significant reduction in design complexity and cost, due to the reduced size of the two smaller crossbar switch matrices 1402, 1404 relative to the original full crossbar switch matrix. Other embodiments can "generalize" this concept to include any number of independent crossbar switch matrices of any number of sizes, including cases where some parallel inputs bypass the crossbar switch matrices entirely and hence cannot be rerouted to other meta-scan shift elements.

Figure 15:
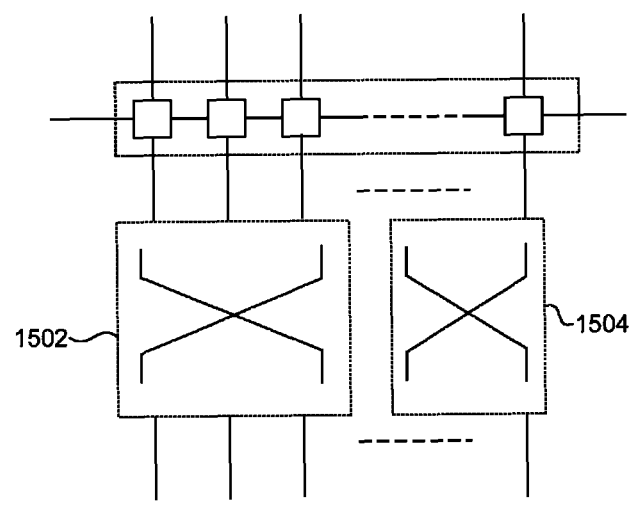

FIG. 15 shows an embodiment with a similar generalized scan output reconfiguration block 902 to that shown in FIG. 13, but with the same crossbar switch modifications as was shown in FIG. 14 and discussed above. In particular, the single full crossbar 1300 switch has been replaced with some number of smaller crossbar switches 1502, 1504 of various sizes. Again, this can be generalized to any number of crossbar switch matrices, including having some number of signals bypass the crossbar switches entirely.

By implementing embodiments of the scan reconfiguration logic described herein, it is possible to maintain identical scan test controllability and observability even if some device pins are unavailable for testing for any reason. Such reasons might include device packaging variants such as multi-chip modules or reduced-pin packaging to lower device manufacturing cost. Reasons might also include reduced pin test equipment to lower device test cost. Regardless of the reason or reasons, embodiments of this invention provides complete flexibility to make such decisions without requiring redesign of the device or regeneration of scan test data, or any loss of test coverage.

This disclosure implies a wide variety of alternate embodiments, including, but not limited to, varying meta-scan shift width, crossbar switch matrix width, use of scan reconfiguration blocks only on scan inputs or only on scan outputs, use of multiple scan reconfiguration blocks, etc. The description herein is not intended to limit the scope of this disclosure, and all such alternate embodiments are implicitly included in the invention.

Implementing this invention in a production IC provides economic benefits to the IC vendor in the form of greatly increased flexibility in production testing and marketing of the device. Production test costs may be reduced by migrating mature tests to lower cost test equipment with reduced pin count. Packaging costs may be reduced by eliminating unused pins, particularly where a SOC device may be targeted at a wide variety of customer applications with widely varying requirements. New markets may become available with alternate packaging technology such as multi-chip module (MCM), where many device pins may only be bonded internal to the MCM and be unavailable for production testing.

Normally, such changes would require either a redesign of the IC in order to maintain full access to all device scan chains, or a severe compromise of device test coverage by discarding some or all scan chains testing. However, using the current invention, the scan reconfiguration block(s) enable full scan chain controllability and observability with an arbitrarily reduced set of test pins, thus requiring neither the cost of a redesign nor the compromise of reduced output device quality.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A device under test (DUT) comprising:
a plurality of scan chains;
a plurality of shift register elements, each associated with a respective one of the scan chains; and
a programmable switch matrix to configure shift register elements of a subset of the plurality of shift register elements to cause one shift register element of the subset to receive an interleaved test sequence, and to cause the interleaved test sequence to be shifted to other shift register elements in the subset and to input deinterleaved test sequences to scan chains associated with the subset.

2. The DUT of claim 1, further comprising a plurality of device scan pins each associated with a shift register element.

3. The DUT of claim 2, wherein the device scan pin associated with the one shift register element provides the interleaved test sequence to the subset.

4. The DUT of claim 3, wherein the programmable switch matrix configures multiplexers in each of the shift register elements of the subset such that
the one shift register element uses a parallel path to receive the interleaved test sequence from the device scan pin associated with the one shift register element; and
the other shift register elements in the subset use a serial path to receive the interleaved test sequences from the one shift register element.

5. The DUT of claim 4, wherein the programmable switch matrix further comprises at least one configurable crossbar switch for routing the interleaved test sequence from any of the device scan pins to any of the plurality of shift register elements.

6. The DUT of claim 5, wherein the at least one configurable crossbar switch is configured to balance the number of shift events between a plurality of subsets.

7. The DUT of claim 3, further comprising a bypass path for bypassing the plurality of shift register elements.

8. The DUT of claim 1, further comprising
a second programmable switch matrix to configure a subset of shift register elements at the output of the scan chains to cause the shift register elements of the subset at the output to receive deinterleaved test sequences to be shifted to one of the shift register elements in the subset at the output, such that an interleaved output test sequence is provided to an output pin associated with the one of the shift register elements in the subset at the output.

9. The DUT of claim 8, wherein the programmable switch matrix configures multiplexers in each of the shift register elements of the subset at the output such that
the one of the shift register elements in the subset at the output uses a parallel path to provide the interleaved output test sequence to the output pin; and, the register elements in the subset at the output use a serial path to provide the deinterleaved test sequences to the one of the shift register elements in the subset at the output.

10. The DUT of claim 9, wherein the programmable switch matrix further comprises at least a second crossbar switch for routing interleaved test sequences from any shift register elements at the output to any output pin.

11. The DUT of claim 10, wherein the at least a second crossbar switch is configured to balance the number of shift events between a plurality of subsets of shift register elements at the output of the scan chains.

12. The DUT of claim 9, further comprising a bypass path for bypassing the shift register elements at the output of the scan chains.

13. A method of testing a device under test (DUT), the DUT having a plurality of scan chains and a plurality of shift register elements each associated with a respective scan chain, the method comprising:
    determining a subset of the plurality of shift register elements to receive an interleaved test sequence;
    programmably configuring one shift register element of the subset to receive the interleaved test sequence;
    receiving the interleaved test sequence at the one shift register element;
    programmably configuring the other shift registers in the subset to shift the interleaved test sequence to others in the subset and to input deinterleaved test sequences to scan chains associated with the subset; and,
    receiving deinterleaved test sequences output from the scan chains.

14. The method of claim 13, wherein programmably configuring includes programmably re-configuring.

15. A device under test (DUT) comprising:
    a plurality of scan chains;
    a plurality of shift register elements, each associated with a respective one of the scan chains; and
    a programmable switch matrix to configure a subset of shift register elements at the output of the scan chains to cause the shift register elements of the subset at the output to receive deinterleaved test sequences to be shifted to one of the shift register elements in the subset at the output and to provide an interleaved output test sequence to an output pin associated with the one of the shift register elements in the subset at the output.

16. The DUT of claim 15, wherein the programmable switch matrix configures multiplexers in each of the shift register elements of the subset at the output such that
    the one of the shift register elements in the subset at the output uses a parallel path to provide the interleaved output test sequence to the output pin; and,
    the register elements in the subset at the output use a serial path to provide the deinterleaved test sequences to the one of the shift register elements in the subset at the output.

17. The DUT of claim 16, wherein the programmable switch matrix further comprises a at least one configurable crossbar switch for routing the interleaved output test sequence from any of the shift register elements to any of a plurality of output pins.

18. The DUT of claim 17, wherein the at least one configurable crossbar switch is configured to balance the number of shift events between a plurality of subsets.

19. The DUT of claim 18, further comprising a bypass path for bypassing the plurality of shift register elements.

* * * * *